US008211781B2

(12) United States Patent
Saito et al.

(10) Patent No.: US 8,211,781 B2
(45) Date of Patent: Jul. 3, 2012

(54) SEMICONDUCTOR MANUFACTURING METHOD

(75) Inventors: Tatsuma Saito, Kanagawa (JP);
Shinichi Tanaka, Kanagawa (JP);
Yusuke Yokobayashi, Kanagawa (JP)

(73) Assignee: Stanley Electric Co., Ltd., Tokyo (JP)

( * ) Notice: Subject to any disclaimer, the term of this patent is extended or adjusted under 35 U.S.C. 154(b) by 449 days.

(21) Appl. No.: 12/615,277

(22) Filed: Nov. 10, 2009

(65) Prior Publication Data
US 2010/0120228 A1 May 13, 2010

(30) Foreign Application Priority Data
Nov. 10, 2008 (JP) ................................ 2008-287862
Nov. 10, 2008 (JP) ................................ 2008-287863

(51) Int. Cl.
*H01L 21/461* (2006.01)
(52) U.S. Cl. ........ 438/458; 438/459; 438/463; 438/464; 438/977; 257/E21.238
(58) Field of Classification Search .................. 438/458, 438/459, 463, 464, 977; 257/E21.238
See application file for complete search history.

(56) References Cited

U.S. PATENT DOCUMENTS

| 5,972,781 | A  | * | 10/1999 | Wegleiter et al. | 438/464 |
|-----------|----|---|---------|------------------|---------|
| 6,117,347 | A  | * | 9/2000  | Ishida           | 216/52  |
| 6,805,808 | B2 | * | 10/2004 | Fujii et al.     | 216/52  |
| 6,818,531 | B1 | * | 11/2004 | Yoo et al.       | 438/458 |
| 7,435,664 | B2 | * | 10/2008 | Lu et al.        | 438/458 |
| 7,465,592 | B2 |   | 12/2008 | Yoo              |         |
| 7,544,588 | B2 | * | 6/2009  | Genda            | 438/463 |
| 7,563,629 | B2 | * | 7/2009  | Lee et al.       | 438/458 |
| 7,927,985 | B2 | * | 4/2011  | Tanaka et al.    | 438/507 |
| 8,097,493 | B2 | * | 1/2012  | Nihei et al.     | 438/113 |
| 2004/0248377 | A1 | * | 12/2004 | Yoo et al.    | 438/458 |
| 2005/0242365 | A1 |   | 11/2005 | Yoo           |         |
| 2007/0293021 | A1 | * | 12/2007 | Yoshikawa     | 438/463 |
| 2010/0059781 | A1 | * | 3/2010  | Yokobayashi et al. | 257/98 |
| 2010/0120237 | A1 | * | 5/2010  | Tanaka et al. | 438/507 |
| 2010/0248451 | A1 | * | 9/2010  | Pirogovsky et al. | 438/463 |
| 2010/0317172 | A1 | * | 12/2010 | Morikazu      | 438/463 |
| 2011/0095330 | A1 | * | 4/2011  | Saito et al.  | 257/99  |
| 2011/0104835 | A1 | * | 5/2011  | Nihei et al.  | 438/28  |
| 2011/0217803 | A1 | * | 9/2011  | Nihei et al.  | 438/46  |

FOREIGN PATENT DOCUMENTS

JP          61095544 A  *  5/1986
JP       2007-536725 A     12/2007

* cited by examiner

*Primary Examiner* — Zandra Smith
*Assistant Examiner* — Toniae Thomas
(74) *Attorney, Agent, or Firm* — Chen Yoshimura LLP

(57) ABSTRACT

A manufacturing method for semiconductor devices having a metal support is provided. The method in one aspect includes growing a semiconductor film on a growth substrate; forming a metal support on a surface of said semiconductor film opposite to the growth substrate; thereafter removing said growth substrate from said semiconductor film; forming a street groove reaching said metal support in the said semiconductor film; radiating a first laser beam onto said metal support to form a first dividing groove having a substantially flat bottom in said metal support; and radiating a second laser beam onto said metal support to form a second dividing groove that penetrates through a portion of said metal support that remains where the first dividing groove is formed.

16 Claims, 7 Drawing Sheets

SEMICONDUCTOR MANUFACTURING METHOD

BACKGROUND

1. Technical Field

The present invention relates to a manufacturing method of a semiconductor device. More specifically, the present invention relates to a dicing technique of a semiconductor device having a metal support by using a laser scribing method.

2. Related Art

Owing to the technological progress of recent years, optical semiconductor devices, such as a light emitting diode, have achieved a higher efficiency and higher output powers. However, along the increase in the output power, the amount of heat generated by the optical semiconductor device has increased, which has caused a problem of reliability degradation such as efficiency degradation of an optical semiconductor device and deterioration of a semiconductor film. In order to solve these problems, the growth substrate that typically has a relatively low thermal conductance has been discarded and replaced with a structure in which a metal support having a relatively high thermal conductance is provided to support semiconductor films (Patent Document 1). With the support structure described above, heat dissipation of an optical semiconductor device is improved and in addition, due to the removal of the growth substrate, the light emitting efficiency, specifically the light extracting efficiency, is improved. More specifically, it becomes possible to reduce absorption of light passing through the growth substrate as well as reduce a component of the light that is totally reflected at an interface between the semiconductor film and the growth substrate due to the difference in their respective refractive indices.

When a metal is used to support a semiconductor film in place of the growth substrate, it is common to use a laser scribing method in order to dice semiconductor devices that include the metal support in a wafer state into individual chips. In a laser scribing method, a laser beam is radiated along dividing lines of a wafer so that the energy of the leaser beam forms dividing grooves by heating and melting or evaporating the material, thereby separating the wafer into individual semiconductor chips. The reason why such a method is used is because it is difficult to divide a wafer stably by using other methods and the difficulty of the dividing affects the yield. For example, in a dicing method, due to the ductibility of the metal which constitutes the support, clogging of a dicing blade often occurs, and a blade needs to be replaced a number of times during the dicing process of the semiconductor device, which leads to a decrease of the work efficiency and an increase in the production cost. On the other hand, in a scribing/breaking method, there is a problem in that the wafer is only bent due to the ductibility of the metal, and a wafer cannot be divided. In these dicing method and scribing/breaking method, the thicker the metal support is, the more significant the above mentioned problem becomes.

[Patent Document 1] Japanese Laid-Open Patent Application Publication No. 2007-536725.

However, even when a semiconductor device having a metal support is separated by using the laser scribing method, there have been the following problems.

In a semiconductor device having a metal support, before cutting a metal support by a laser scribing method, grid-like grooves (called as "street grooves" hereinafter) are formed in a semiconductor film along the dividing lines of semiconductor devices so as to partition semiconductor devices into rectangular compartments. As a result, the metal support is exposed at the bottom of the street grooves. Then, a laser beam is radiated onto the metal support that is exposed along the street groves, and dividing grooves are thereby formed by melting or evaporating the metal support using the energy of the laser beam. This should complete the device separation. However, the device separation may not properly occur, if a molten metal caused by the irradiation of the laser is not completely removed and remains inside the dividing groove, causing welding of the metal support again in the dividing groove. FIG. 1 is a cross-sectional photograph of a metal support in which a dividing groove is formed by using a conventional laser scribing method. As shown in the figure, when a semiconductor device has a thick metal support or when a low power laser is used, the molten metal may weld the metal support again inside the dividing groove, resulting in an incomplete device separation. In such a situation, due to the ductibility of a metal, trying to break the wafer leads to bending of the wafer and not to a proper separation of semiconductor devices, or results in diced semiconductor devices that have metal burrs on their sides, which causes a difficulty in insuring a high yield.

In order to avoid these improper separations, a higher power laser output is required. However, when a high power laser is radiated onto the metal support, metal particles fly apart from the metal support, and are attached on the side face of the semiconductor film, causing current leakage and/or short circuit, which are undesirable. In order to solve the problem of the metal attachment, the width of the street grooves needs to be widened so that the spacing between neighboring semiconductor devices is enlarged. However, increasing the width of the street grooves would result in increased production costs, because the number of semiconductor devices that can be made out of a single wafer (in other words, the "chip yield" of semiconductor devices) would be reduced. As described above, for semiconductor devices having a metal support, it has been difficult to achieve proper separation of semiconductor devices while ensuring appropriate levels of the production yield and the chip yield.

Because of the fact that the thicker a metal support is, the more significant the above mentioned problems become, from the point of view of insuring the production yield rate and the chip yield in the conventional manufacturing method, the thickness of the metal support has been considered to be limited to about 60 µm or less. On the other hand, considering heat dissipation performance and handling ability (the ease of mounting to each device and transportation) of semiconductor devices, it is desirable that the thickness of a metal support film be increased. Therefore, it has been desired to have a manufacturing method by which semiconductor devices having a metal support of 60 µm or larger in thickness can be stably manufactured.

SUMMARY OF INVENTION

The present invention was made in view of the above mentioned points. An object of the present invention is to provide a manufacturing method for semiconductor devices which allows the dicing of semiconductor devices having a relatively large film thickness of a support metal without a reduction of the production yield and the chip yield.

In one aspect of the present invention, the present invention provides a manufacturing method for semiconductor devices having a metal support, including growing a semiconductor film on a growth substrate; forming a metal support on a surface of said semiconductor film opposite to the growth substrate; thereafter removing said growth substrate from the said semiconductor film; forming a street groove reaching said metal support in the said semiconductor film; radiating a first laser beam onto said metal support that has been exposed at a bottom of said street groove to form a first dividing groove having a substantially flat bottom in said metal support; and radiating a second laser beam onto said bottom of the first dividing groove to form a second dividing groove penetrating through the metal support and having a width smaller than a width of the first dividing groove.

In another aspect, the present invention provides a manufacturing method for semiconductor devices having a metal support, including growing a semiconductor film on a growth substrate; forming a metal support on a surface of said semiconductor film opposite to the growth substrate; thereafter removing said growth substrate from said semiconductor film; forming a street groove reaching said metal support in the said semiconductor film; radiating a first laser beam onto a surface of said metal support from a side opposite to a side on said semiconductor film is formed to form a first dividing groove having a substantially flat bottom in said metal support; and radiating a second laser beam onto a surface of said metal support that has been exposed at a bottom of said street groove to form a second dividing groove reaching a bottom of the first dividing groove, thereby penetrating through said metal support.

In another aspect, the present invention provides a manufacturing method for semiconductor devices having a metal support, including growing a semiconductor film on a growth substrate; forming a metal support on a surface of said semiconductor film opposite to the growth substrate; thereafter removing said growth substrate from said semiconductor film; forming a street groove reaching said metal support in the said semiconductor film; radiating a first laser beam onto said metal support to form a first dividing groove having a substantially flat bottom in said metal support; and radiating a second laser beam onto said metal support to form a second dividing groove that penetrates though a portion of said metal support that remains where the first dividing groove is formed.

By using a manufacturing method of the present invention, it becomes possible to achieve proper separation of semiconductor devices while ensuring appropriate levels of the production yield and the chip yield even when the semiconductor devices have a metal support having a relatively large film thickness. Therefore, the thickness of the metal support can be increased as compared with the conventional art, and semiconductor devices which have improved heat dissipation performance and handling ability can be manufactured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

In the drawings.

DESCRIPTION OF EMBODIMENTS

Figure 1:
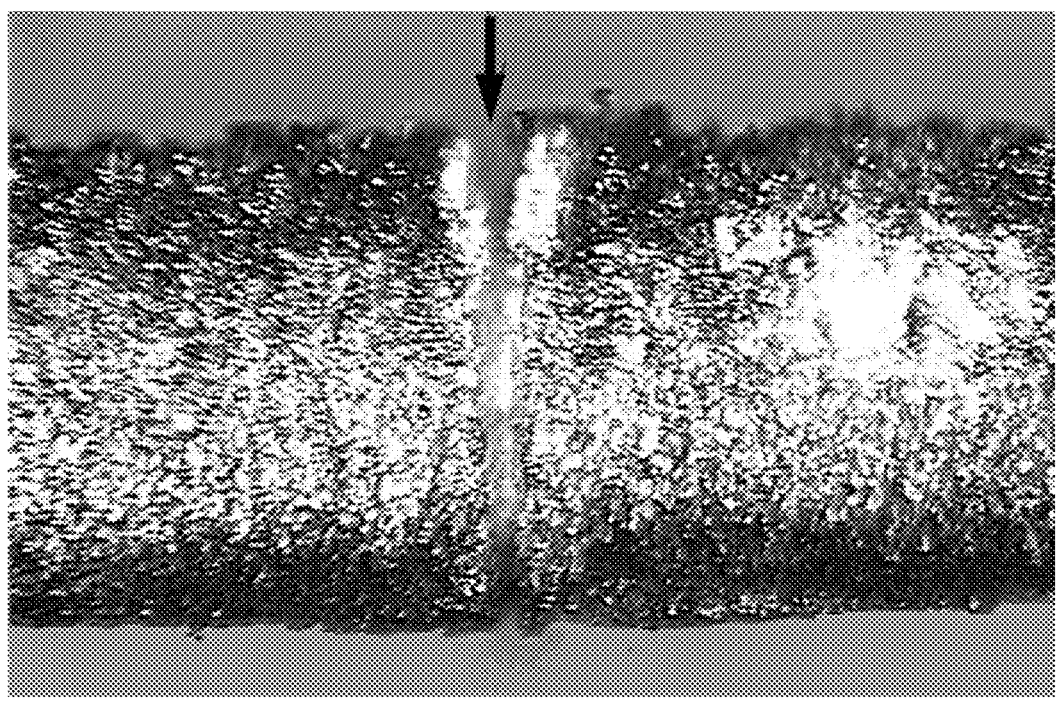
FIG. 1 is a cross-sectional photograph of a metal support in which a dividing groove is formed by using a conventional laser scribing method.

In the following, preferred embodiments of the manufacturing method of semiconductor devices of the present invention will be explained in detail with reference to attached figures. Also, in the following figures, the same symbols or reference numerals are used to represent identical or similar structural elements and parts.

First Embodiment

Figure 2A:
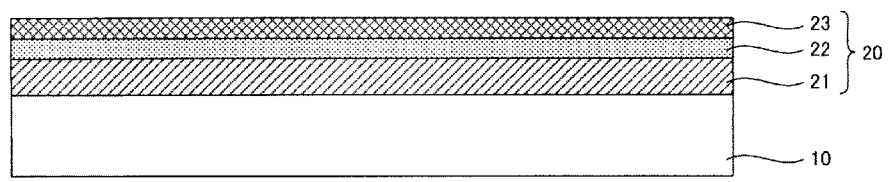
FIGS. 2A-2D are cross-sectional views showing a manufacturing method according to an embodiment of the present invention.
Figure 2B:
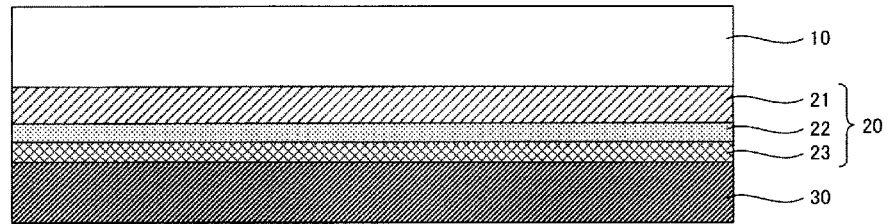
Figure 2C:
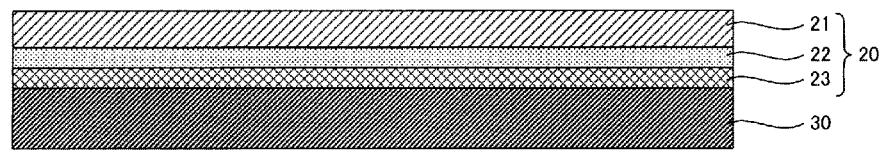
Figure 2D:
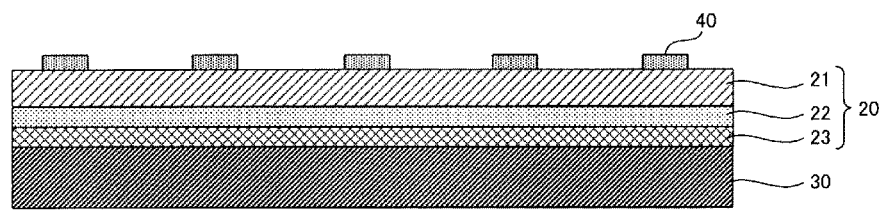
Figure 3E:
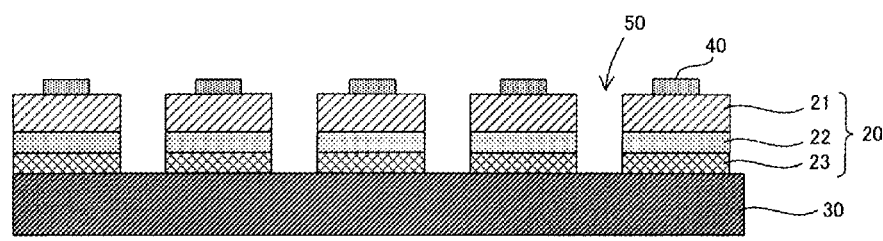
FIGS. 3E-3G are cross-sectional views showing a manufacturing method according to the first embodiment of the present invention.
Figure 3F:
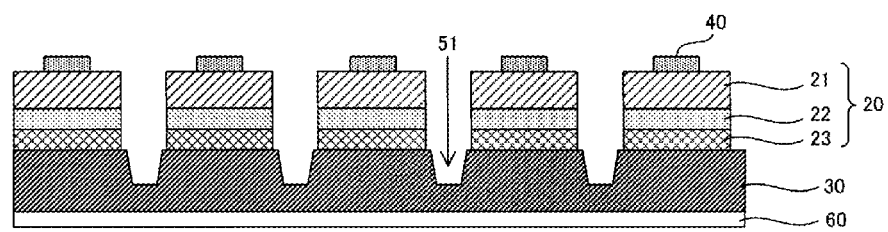
Figure 3G:
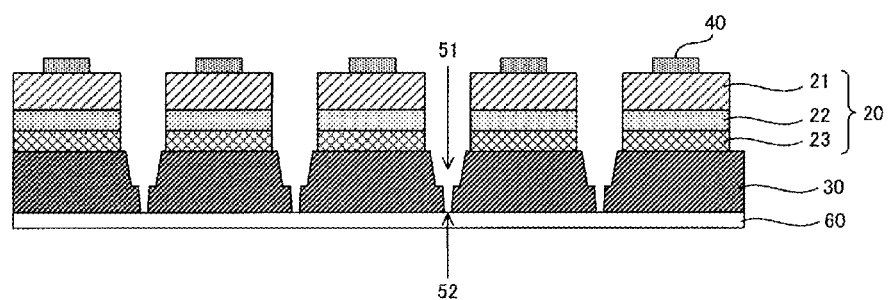
Figure 4:
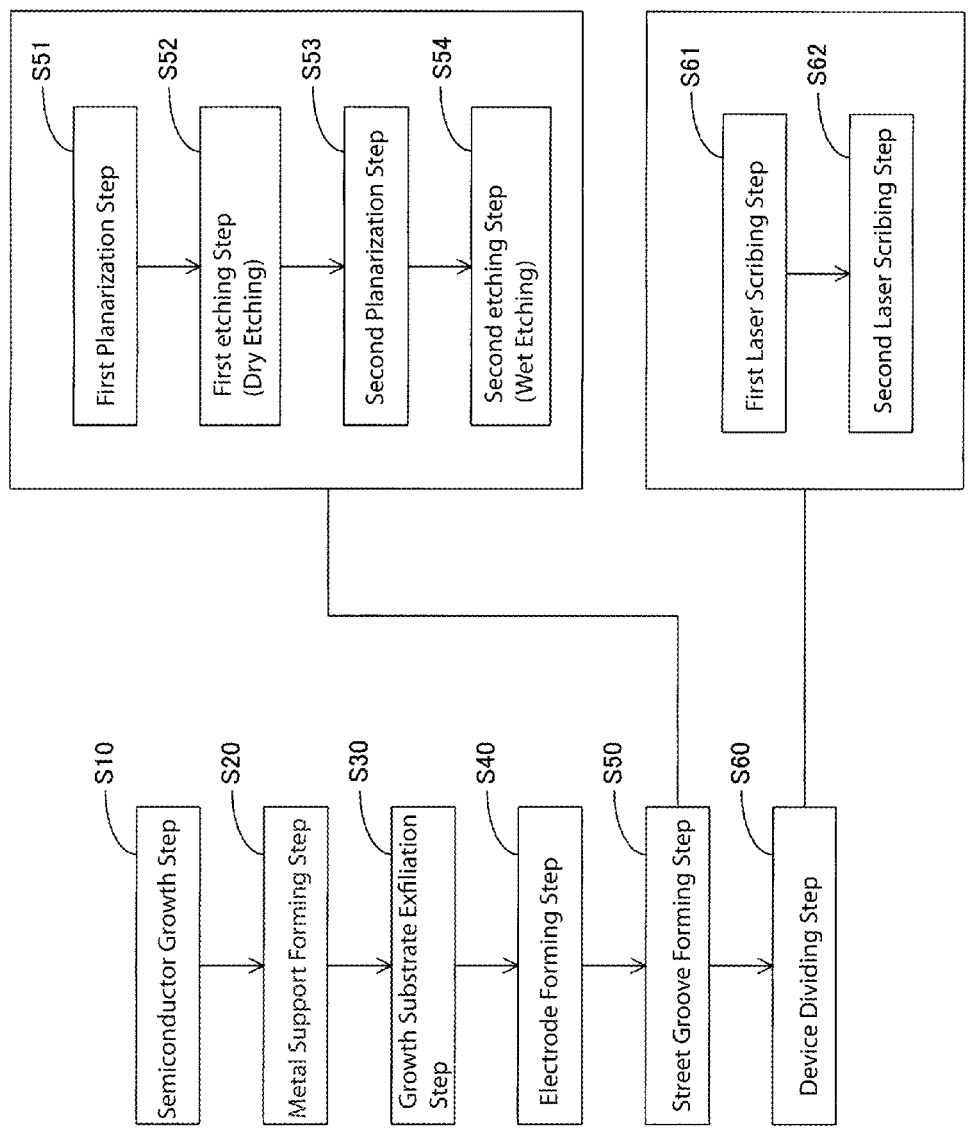
FIG. 4 is a flow chart showing a manufacturing method of an embodiment of the present invention.

FIGS. 2A-2D and FIGS. 3E-3G are cross-sectional figures showing a manufacturing method of optical semiconductor devices according to a first embodiment of the present invention. FIG. 4 is a flow chart showing a manufacturing method of optical semiconductor devices according to the first embodiment of the present invention.

(Semiconductor Layer Growth Step; Step S10) A growth substrate is prepared. In the present embodiment, a C-plane sapphire substrate 10 is used as a growth substrate because a semiconductor film made of $Al_xIn_yGa_zN$ ($0 \leq x \leq 1$, $0 \leq y \leq 1$, $0 \leq z \leq 1$, $x+y+z=1$) can be formed thereon using the MOCVD method (metal organic chemical vapor deposition method). Each of the layers that constitute the semiconductor layer 20 is laminated on the sapphire substrate 10 along the C-axis direction of the wurtzite-type crystal structure by using the MOCVD method.

First, the thermal cleaning of the sapphire substrate 10 is performed. Specifically, the sapphire substrate 10 is introduced in an MOCVD apparatus. Then the sapphire substrate 10 is heat-treated in a hydrogen atmosphere at a temperature of about 1000° C. for about 10 minutes. Next, a low temperature buffer layer (not shown in a figure), which is made of a GaN layer, is formed by lowering the temperature of the atmosphere to 500° C. and supplying the TMG (trimethyl gallium) (flow rate at 10.4 µmol/min) and $NH_3$ (flow rate at 3.3 LM) for about 3 minutes. After that, the low temperature buffer layer is crystallized by raising the temperature of the atmosphere to 1000° C. and keeping that temperature for about 30 seconds.

Next, a base GaN layer (not shown in a figure) having a film thickness of about 1 µm is formed by supplying TMG (flow rate at 45 µmol/min) and $NH_3$ (flow rate at 4.4 LM) for about 20 minutes while keeping the temperature of the atmosphere at 1000° C. Next, an n-GaN layer 21 having a film thickness of about 2 µm is formed by supplying TMG (flow rate at 45 µmol/min), $NH_3$ (flow rate at 4.4 LM), and $SiH_4$ as a dopant gas (flow rate at $2.7 \times 10^{-9}$ mol/min) for about 40 minutes at the temperature of the atmosphere at 1000° C.

Next, an active layer 22 is formed on the n-GaN layer 21. In the present embodiment, for the active layer 22, a multiple quantum well structure which is made of InGaN/GaN is applied. The growth of five cycles are done where one cycle is made of InGaN/GaN. Specifically, an InGaN well layer having a film thickness of about 2.2 nm is formed by supplying TMG (flow rate at 3.6 μmol/min), TMI (trimethyl indium) (flow rate at 10 μmol/min) and $NH_3$ (flow rate at 4.4 LM) for about 33 seconds at the temperature of the atmosphere at 700° C., and subsequently, a GaN barrier layer having a film thickness of about 15 nm is formed by supplying TMG (flow rate at 3.6 μmol/min) and $NH_3$ (flow rate at 4.4 LM) for about 320 seconds. The active layer 22 is formed by repeating such cycle processes for five cycles.

Next, a p-type AlGaN cladding layer (not shown in a figure) having a film thickness of 40 nm is formed by raising the temperature of the atmosphere to 870° C., and supplying TMG (flow rate at 8.1 μmol/min), TMA (trimethyl aluminum) (flow rate at 7.5 μmol/min), $NH_3$ (flow rate at 4.4 LM), and CP2Mg (bis-cyclopentadienyl Mg) (flow rate at $2.9 \times 10^{-7}$ μmol/min) as a dopant for about 5 minutes. Subsequently, while keeping the temperature of the atmosphere, a p-GaN layer 23 having a film thickness of about 150 nm is formed by supplying TMG (flow rate at 18 μmol/min), $NH_3$ (flow rate at 4.4 LM), and CP2Mg (flow rate at $2.9 \times 10^{-7}$ μmol/min) as a dopant for about 7 minutes. (FIG. 2A)

(Metal Support Forming Step; Step S20) Next, a metal support 30 is formed on the p-GaN layer 23. The metal support 30 supports the semiconductor film 20 as well as takes a role of dissipating the heat generated by and transferred from the semiconductor film 20. In the present embodiment, as a metal support, a copper having relatively high thermal conductivity was used. The metal support 30 which is made of copper films can be formed by using the electrolytic plating method. Specifically, in a cyanide copper based or copper sulfate based plating bath, a laminated structure having the semiconductor film 20 laminated on the sapphire substrate 20, is immersed, and then a copper film having a film thickness of about 80 μm is grown on the p-GaN layer 23, resulting in forming a metal support 30. In this case, in order to adjust the mechanical characteristics such as rigidity and flatness of the copper plated film, a smoothing material and a brightening agent, which can be based on organic materials, may be used as additives (FIG. 2B).

(Growth Substrate Exfoliation Step; Step 30) Next, the sapphire substrate 10 is exfoliated from the semiconductor film 20. In the process of exfoliation of the sapphire substrate 10, a known method such as the LLO (Laser Lift Off) method can be used. In the LLO method, the radiated laser beam disintegrates a GaN layer which is formed on the sapphire substrate into metallic Ga and an $N_2$ gas. Consequently, the above mentioned disintegration occurs in the n-GaN layer 21 or in the base GaN layer, thereby exposing the n-GaN layer 21 or the base GaN layer on a surface exposed as a result of the exfoliation of the sapphire substrate. On the surface of the n-GaN layer 21, which is exposed after the exfoliation of the sapphire substrate 10, there exist a number of traces of the laser beam is formed along the scanning lines of the laser beam and a number of pits, which are caused by the threading dislocation generated during the growing of the crystal. Therefore, the surface of the n-GaN layer 21 has an asperity having the depth of about 40-50 nm (FIG. 2C).

(Electrode Forming Step; Step S40) Next, on the surface of the n-GaN layer 21, which is exposed after the exfoliation of the sapphire substrate 10, electrode pads 40 are formed by the lift off patterning method, for example. Specifically, on the n-GaN layer 21, a resist mask opposite to the desired electrode pattern is formed, then a metal film such as TiAl is deposited by vacuum evaporation. Subsequently, unused parts are removed together with a metal and a resist mask, which results in forming desired pattern of electrode pads 40. After that, in order to form an ohmic contact between the electrode and the semiconductor film, the RTA (Rapid Thermal Annealing) process at a temperature of 500° C. for 20 seconds is applied. Here, a transparent conductive layer made of ITO (Indium Tin Oxide) may be formed on the substantially entire surface of the n-GaN layer 21, and then thereafter, the electrode pads, which may be formed of TiAl, etc., can be formed on the ITO film (FIG. 2D).

(Street Groove Forming Step; Step S50) This process exposes the metal support 30 by removing the semiconductor film 20 along the device dividing lines in advance of the laser scribing process which dices semiconductor devices into chip states. Street grooves are constructed of multiple grooves formed in a matrix form in the semiconductor film, and reach the metal support. Street grooves partition the semiconductor film 20 into rectangular compartments, for example. A street groove forming step includes a first etching step (step S52) in which a groove is formed by the dry etching (RIE: Reactive Ion Etching) from the surface of the semiconductor film to a depth that does not reach the metal support, and a second etching step (step S54) in which the groove made in the first etching process is further etched, and the metal support 30 is exposed, which completes the street grooves. Furthermore, in advance of the first and the second etching steps, first and second planarization steps (step S51, step S53) are provided, respectively, to planarize the surface of the semiconductor film on which the etching process is applied. In the following, details of the street groove forming process are explained with reference to FIG. 5.

Figure 5A:
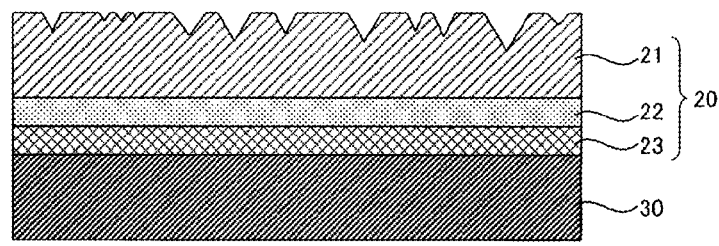
FIGS. 5A-5E are cross-sectional views showing a manufacturing method according to an embodiment of the present invention.
Figure 5B:
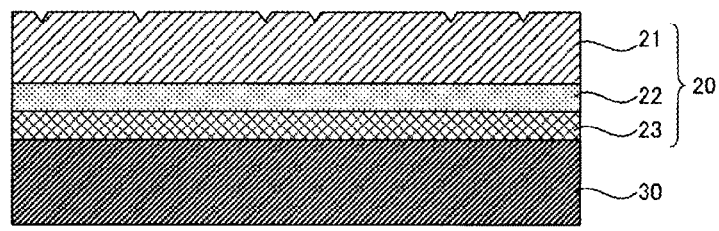

(First Planarization Step, Step S51) A wafer having the metal support 30 formed thereon is introduced into a RIE system, and physical dry etching of the semiconductor film 20 is performed by using a plasma of a rare gas such as Ar. This amounts to a planarization process of the surface of the n-GaN layer 21, which has been exposed as a result of the exfoliation of the sapphire substrate 10. As mentioned above, on the surface of the n-GaN layer 21 which is exposed after the exfoliation of the sapphire substrate 10 by using the LLO method, traces of the laser beam and multiple pits due the threading dislocation are formed, whereby the surface of the n-GaN layer 21 has an asperity having the depth of about 40-50 nm. That is, on the surface of the n-GaN layer 21 after performing the LLO method, all sorts of crystal faces exist and are distributed unevenly. Therefore, the surface is in a condition that crystal faces stable for chemical etching and crystal faces unstable for chemical etching are unevenly distributed (FIG. 5A). In such a surface condition, residues may remain in subsequent etching processes. Therefore, the surface of the n-GaN layer 21 is planarized by applying dry etching of the semiconductor film 20 using the Ar plasma, thereby creating, on the surface, a uniform distribution of crystal faces on which chemical etching is efficiently performed. This prevents occurrence of the etching residues. The conditions for the Ar etching were: the processing pressure was 1.0 Pa, the Ant Power was 200 W, the Bias Power was 50 W, the Ar flow rate was 50 sccm, the processing time was 840 seconds. Under these conditions, the etching rate of the semiconductor film is close to zero. Therefore, the film thickness of the semiconductor film 20 does not significantly change, and the asperity due to the traces of the laser beam and the pits and the like formed on the surface of the n-GaN layer 21 is removed (FIG. 5B).

(Dry Etching Step (First Etching Step); Step S52) Next, the wafer is taken out of the RIE system, and a resist mask (not shown in the figure) having an opening corresponding to the street grooves formation area is formed on the surface of the planarized n-GaN layer 21 by using the photolithography etc. Next, the wafer is introduced into the RIE system again, by applying the dry etching process of the semiconductor film 20 using a $Cl_2$ plasma, a groove 50 (called as a "street groove" hereinafter), which constitutes a street groove and which does not reach the metal support 30, is formed in the semiconductor film 20. Because of the use of the $Cl_2$ plasma, the process is a RIE (Reactive Ion Etching) process in which the sputtering by ions and a chemical reaction by the etching gas occur simultaneously, thereby reducing the processing time dramatically as compared with the processing time when only wet etching is used. Also, because this dry etching is completed before the street groove 50 reaches the metal support, the metal support 30 is not exposed to the plasma, therefore no metal particles fly out in the processing atmosphere.

Figure 5C:
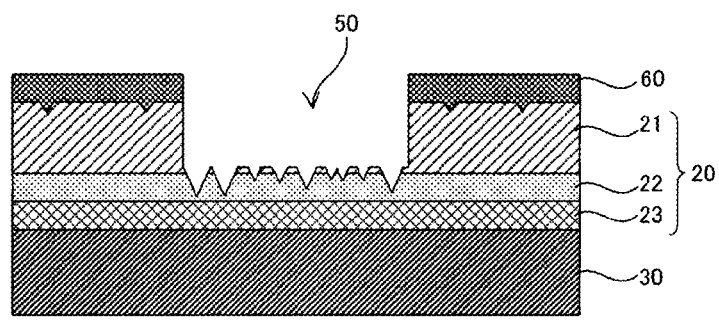

It is preferred that the thickness of the semiconductor film in the street forming area after the $Cl_2$ dry etching is in a range of about 0.5 μm-3 μm. When the thickness of the remaining film of the semiconductor film 20 is too small (less than or equal to 0.5 μm), the metal support 30 may be exposed by Ar plasma etching that will be performed in the subsequent second planarization process, and as a result, metal particles may be attached to the semiconductor film 20 by having metal particles fly around in the plasma atmosphere. On the other hand, when the thickness of the remaining film of the semiconductor film 20 is too large (larger than or equal to 3 μm), in the subsequent wet etching process, the processing time becomes long and crystal faces having a slow etching rate can be exposed, which in turn may result in etching residues. Therefore in the present embodiment, the thickness of the semiconductor film that remains in the street forming area after the $Cl_2$ dry etching (the first etching process) is preferably set to be at about 1 μm, considering the following various factors: the metal support 30 should not be exposed in the subsequent second planarization process using an Ar plasma; the semiconductor film in the street forming area should be removed completely by a subsequent wet etching process (a second etching process) in relatively short time without leaving any residue after the etching; and also in the wet etching process, six-sided pyramid-like projections having the height of about 1-3 μm are formed on the surface of the n-GaN layer 21 in order to improve the extraction efficiency of the light. Specific processing conditions were: the processing pressure was 0.2 Pa, the AntPower was 200 W, the Bias Power was 50 W, the $Cl_2$ flow rate was 20 sccm, and the processing time was 1428 seconds (FIG. 5C).

(Second Planarization Step; Step S53) The etching rate of the dry etching by using the $Cl_2$ plasma is much higher than that by using the Ar plasma, therefore the dry etching by using the $Cl_2$ plasma is suitable for the removal of semiconductor films. However, because the dry etching using the $Cl_2$ plasma includes chemical etching in the same way as the anisotropic wet etching, crystal faces that are stable against etching and having a relatively slow etching rate appear, thereby forming numerous indents and bumps having the depth of about several hundred nm at the bottom surface of the street groove. With the state of having numerous indents and bumps on the bottom of the street grove, it is highly possible that etching residues remain in the wet etching in the following second etching process. Therefore, physical dry etching by using an Ar plasma is performed again following the $Cl_2$ plasma dry etching to planarize the bottom of the street groove 50 in order to prevent generation of etching residues. Specific processing conditions were: the processing pressure was 1.0 Pa, the AntPower was 200 W, the Bias Power was 50 W, the Ar flow rate was 50 sccm, and the processing time was 840 seconds.

Figure 5D:
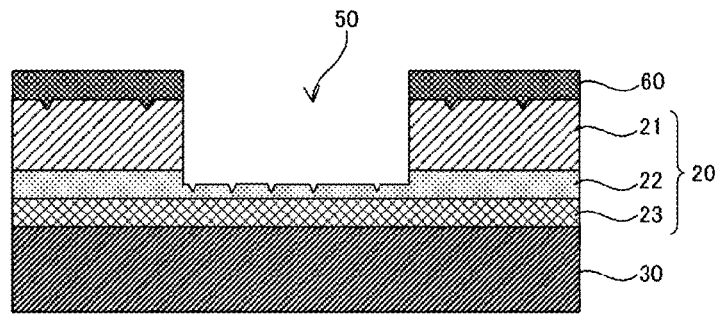

Also, if the $Cl_2$ dry etching is performed without performing the first planarization process in advance, the asperity of the surface of the semiconductor film 20 after the etching becomes more significant, and it becomes difficult to planarize the surface of the semiconductor film 20 in the second planarization process. Therefore, it is effective to planarize the surface of the semiconductor film 20 in advance of the $Cl_2$ dry etching on the first planarization process (FIG. 5D).

(Wet Etching Step (Second Etching Step); Step S54) Next, wet etching is performed to the exposed semiconductor film on the bottom of the street groove 50, and the remaining semiconductor film 20 having the thickness of about 1 μm in the street forming area is removed. This leads to the exposure of the metal support 30 at the bottom of the street groove 50 and the completion of the street grooves which partitions the wafer into individual semiconductor devices. Specifically, 5M-KOH was used as the etchant, the processing temperature was at 90° C., and the processing time was 120 minutes.

As explained above, because the street groove is completed by exposing the metal support 30 by using wet etching, it becomes possible to avoid various failure modes, such as current leakage and/or short circuit due to the attached metal particles which fly apart in the etching process on the semiconductor film. Also, the film thickness of the semiconductor film 20 in the street forming area after the previous first etching process is set to be about 1 μm, and in the previous second planarization process, the surface of the semiconductor film at the bottom of the street groove 50 is planarized. Because of this, in the present wet etching process, it becomes possible to form a street groove without leaving any etching residues.

Figure 5E:
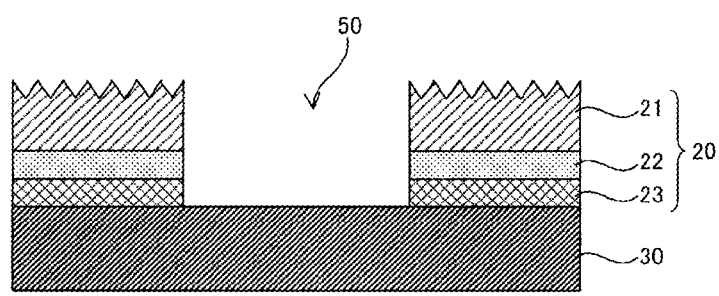

Also, in the present wet etching process, in addition to forming the street grooves, six-sided pyramid-like projections can be formed on the surface of the n-GaN layer 21 for improving the extraction efficiency of the light. By adding such an uneven surface profile on the light emitting surface of the optical semiconductor device, it becomes possible to reduce the totally reflected light that enter into the interface between an optical semiconductor device and an encapsulation resin at the angle equal to or larger than the critical angle. This leads to an improvement in the light extraction efficiency. When $Al_xIn_yGa_zN$ ($0 \leq x \leq 1$, $0 \leq y \leq 1$, $0 \leq z \leq 1$, $x+y+z=1$) is grown on a typical growth substrate (for example, C-plane sapphire, C-plane GaN, SiC, etc.), the surface of the n-GaN layer 21 exposed by the exfoliation of the growth substrate is constructed by the C-plane (N-plane). Thus, it is possible to form the six-sided pyramid-like projections owing to the wurtzite-type crystal structure, by applying an appropriate anisotropic wet etching process. Therefore, by removing the resist mask formed on the surface of the n-GaN layer 21 to expose the n-GaN layer in advance of the present wet etching process, the street groove and the six-sided pyramid-like projections for the improvement of the light extraction efficiency can be formed simultaneously in the present wet etching process. As described above, it is preferable that the street grooves 50 are formed to leave about 1 μm of the semiconductor film 20 in the first etching step so that the height of the six-sided pyramid-like projections becomes about 1 μm to about 3 μm when the street grooves are completed (FIG. 5E).

(Device Dividing Step; Step S60) Along the street groove 50 formed on the semiconductor film 20, the metal support 30 is cut by using a laser scribing method using YAG crystal (Yttruim•Aluminium•Garnet) as a laser medium, for example, so that the semiconductor devices are separated. Here, the devices are separated by using two stages of the laser beam radiation having different laser emission conditions, which respectively form dividing grooves having different cross-sectional shapes on metal support 30. Namely, in the first laser scribing step (step 61), the first dividing groove 51 having a trapezoidal or rectangular cress section is formed by radiating a laser beam along the street groove 50 onto the metal support 30 that has been exposed at the bottom of the street groove 50. In the second laser scribing process, a second dividing groove 52 having a narrower groove width than the first dividing groove 51 and having a V-shaped (that is, a sharp-angled tip-like) cross-section is formed by radiating a laser beam onto the bottom of the first dividing groove 51, in order to separate the devices. In the following, details of the dividing process of the devices are described.

(First Laser Scribing Step; Step S61) The wafer is held by adhering an adhesive tape 60 to the surface of the metal support 30, which is on the opposite side to the side of the metal support contacting the wafer. Next, the first dividing groove 51 having a trapezoidal or rectangular cross-section that does not penetrate through the metal support 30 (that is, the groove ends within the metal support) is formed by radiating a laser beam along the street groove 50 onto the exposed part of the metal support 30 at the bottom of the street groove 50. In the laser scribing method, the shape, the depth, and the width of the dividing groove can be controlled by the conditions of the laser beam radiation.

Figure 6:
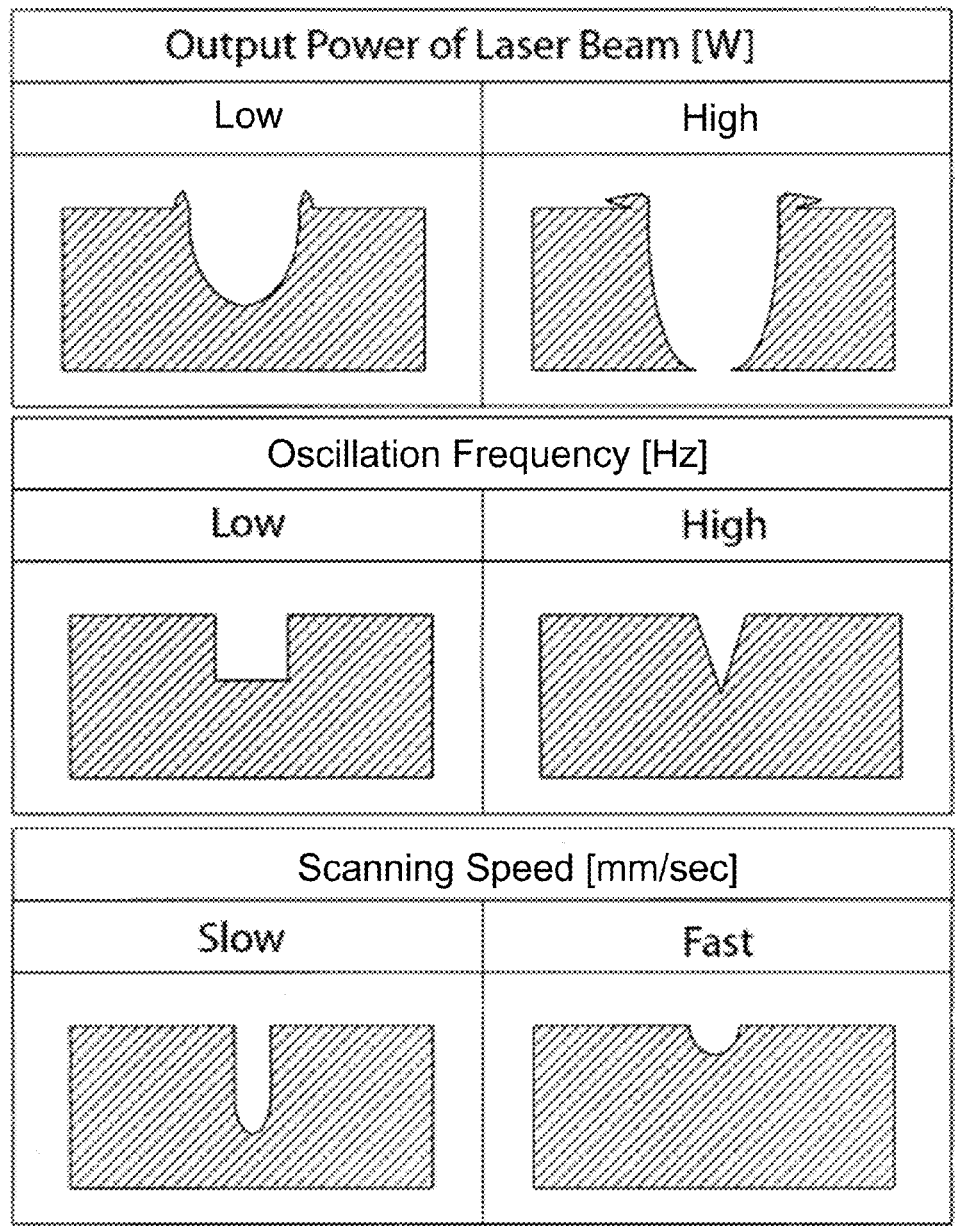
FIG. 6 shows cross-sections of dividing grooves showing a relation between the radiation conditions of the laser beam and the shape of the resulting dividing groove formed in a metal support.

FIG. 6 is a set of figures schematically showing the relation between the conditions of the laser beam radiation and the shape of the dividing groove formed in the metal support, which was discovered by the inventors. As shown in the figure, the shape, the depth, and the width of the dividing groove can be controlled by the output power of the laser beam, the oscillation frequency, and the scanning speed, etc. That is, when the output power of the laser beam is too small to cut the metal support, a penetrating deep dividing groove cannot be formed. On the other hand, when the laser beam is radiated with the enough output power to penetrate the metal support, it becomes possible to form a penetrating deep dividing groove. However in this case, the width of the dividing groove tends to be wider and the size of the burr tends to be larger. When the oscillation frequency of the radiated laser beam is small, the shape of the dividing groove tends to become rectangular. On the other hand, when the oscillation frequency of the radiated laser beam is large, the shape of the dividing groove tends to be V-shaped. When the scanning speed of the laser is slow, a narrow deep dividing groove tends to be formed. On the other hand, when the scanning speed of the laser is fast, a wide shallow dividing groove tents to be formed. By combining the above-mentioned parameters, a desired dividing groove can be formed in the metal support.

In the present embodiment, the output power of the laser beam was 2 W, the pulse width was 20 nsec, the oscillation frequency was 20 kHz, and the scanning speed was 50 mm/sec. By the radiation of the laser beam under such conditions, the first dividing groove 51 having a trapezoidal cross-section having a depth of about 40 µm is formed in the metal support 30 (FIG. 3F). Also, the oscillation frequency and the scanning speed can be varied in the range of 5-50 KHz and in the range equal to or larger than 50 mm/sec, respectively.

As described above, it is preferable that the first dividing groove 51 has a trapezoidal or rectangular cross-section so that its bottom is a plane. By having a trapezoidal or rectangular cross-section of the first dividing groove 51, it becomes easy to cut the metal support 30 in the subsequent second laser scribing process, which leads to the securing of a high production yield. That is, by having a trapezoidal or rectangular cross-section of the first dividing groove 51, in the subsequent second laser scribing process, it becomes easy to radiate the laser beam directly onto the bottom plane of the first dividing groove 51 without radiating the laser beam onto the side plane of the first dividing groove 51. By radiating the laser beam in such a way in the second laser scribing process, the re-welding inside the dividing groove can be avoided, which makes it possible to separate the devices effectively. If the shape of the first dividing groove 51 were V-shaped and not rectangular, the laser beam radiated in the second laser scribing process could be scattered by the dents and bumps on the side plane of the V-shaped dividing groove, and it could be difficult to focus the laser beam at the bottom of the groove. Thus, when the laser beam is radiated with the radiation conditions to form a V-shaped groove and is swept multiple times on the same line, because the laser beam cannot be focused, enough heat cannot be given to the metal support, and as a result, a deep dividing groove cannot be formed. Also, the same kind of trouble can occur when the bottom of the first dividing groove 51 is not flat. Therefore, it is important to form the first dividing groove 51 having a trapezoidal or rectangular cresssection that has a flat bottom plane in order to separate semiconductor devices effectively.

The deeper the first dividing groove 51 is, the shallower the film thickness of the metal support 30 in the device dividing line, hence the easier the device dividing becomes in the subsequent second laser scribing process. However, in order to make the depth of the first dividing groove 51 large, the output power of the laser beam need to be set high. In this case, the width of the first dividing groove 51 becomes large, and therefore, the width of the street groove must be set wide accordingly, which results in the reduced number of semiconductor devices manufactured from a single wafer. Therefore, the depth of the first dividing groove 51 needs be determined such that the street groove width can be set to be suitable for maintaining the superior mass productivity (preferably equal to or less than about 60 µm) and at the same time stable separation of devices is possible in the second laser scribing process. Also, when the film thickness of the metal support 30 below the first dividing groove 51 is equal to or less than about 40 µm, stable separation of devices is possible in the second laser scribing process. Considering the above mentioned points, in the present embodiment, in order to stably divide devices in the second laser scribing process without unnecessarily increasing the output power of the laser, the depth of the first dividing groove 51 was set to be 40 µm, and the film thickness of the metal support 30 that is left below the first dividing groove 51 was set to be 40 µm.

(Second Laser Scribing Step; Step S62) By radiating a laser beam onto the bottom of the first dividing groove 51 formed in the first laser scribing step with conditions different from those for forming the first dividing groove 51, the second dividing groove 52 having a V-shaped (having a sharp edged tip) cross-section penetrating the metal support 30 is formed. In this case, it is preferable that the laser beam does not irradiate the side plane of the first dividing groove 51 from the perspectives of dividing devices effectively and avoiding the re-welding. Because of this, the groove width of the second dividing groove 52 needs to be made narrow than the groove width of the first dividing groove 51. In order to make such a narrow dividing grove, the cross-section of the dividing groove 52 preferably is V-shaped rather than rectangular-shaped because of its ease in controllability.

In the similar way as in forming the first dividing groove 51, the shape, the depth, and the width of the second dividing groove 52 can be controlled by the output power of the laser beam, the oscillation frequency, and the scanning speed, etc. In the present embodiment, the output power of the laser beam was 1 W, the pulse width was 30 nsec, the oscillation frequency was 50 kHz, and the scanning speed was 10 mm/sec. By radiating the laser beam under such conditions, the second dividing groove 52, which has a groove width narrower than that of the first dividing groove 51 and which penetrates the metal support 30, is formed (FIG. 3G). Also, the oscillation frequency and the scanning speed can be varied in the range of equal to or larger than 50 KHz and in the range of 10-40 mm/sec, respectively, for example.

As described above, by forming the second dividing groove 52 having a V-shaped cross-section and a narrower groove width than the first dividing groove 51, the laser beam having the laser power focused on the bottom of the first dividing groove 51 is radiated. Because of this, it is possible to evaporate the thin film of metal support 30 instantaneously without re-welding the metal support 30, and the metal support can be easily separated, and the semiconductor device is diced into individual chips. By going through above-mentioned steps, the manufacture of the semiconductor devices is completed.

As described above, by using the manufacturing method of the present embodiment, because after forming the first dividing groove 51 having a rectangular cross-section in the metal support 30, the second dividing groove 52 having a V-shaped cross-section and a narrower width than the first dividing groove 51 is formed, it becomes possible to easily cut the metal support having a relatively thick film thickness (equal to or larger than about 60 μm, for example), which has been difficult to divide by using the conventional method. Further, because the device dividing is done in two stages of laser beam radiation, the output power of the laser beam can be reduced compared to that in the conventional dividing method having a single laser beam radiation. Therefore, it becomes possible to reduce the amount of flying metal particles during the laser scribing, resulting an improved yield. Furthermore, comparing with the conventional dividing method, the groove width of the dividing groove can be made narrower, which makes it possible to increase the number of semiconductor devices manufactured out of a single wafer. For example, in the conventional dividing method using a single laser beam radiation, in order to divide a metal support having the thickness of 80 μm, the laser beam radiation needs to have a high output power, and therefore the opening width of the V-shaped dividing groove needs to be wide. As a result, the street groove width needs to be about 120-130 μm, which is not suitable for the mass production from the viewpoint of the production yield and the chip yield. In contrast, in the manufacturing method of the present invention, as described above, the output power of the laser can be reduced, and the groove width can be made narrower because the first dividing groove is formed to have a trapezoidal or rectangular cross-section. Thus, the street groove width of about 50 μm to about 60 μm can be sufficient, thereby making it possible to divide devices without sacrificing the chip yield.

As described above, because in the manufacturing method of the present embodiment, it becomes possible to easily divide devices having a metal support having the film thickness of equal to or larger than 60 μm for which the dividing devices has been difficult by using the conventional method, the film thickness of the metal support can be thicker, and it becomes possible to manufacture semiconductor devices having improved heat dissipation and improved handling ability. Also, in the manufacturing method of the present embodiment, the existing laser scribing apparatus can be used as is, and no new system is necessary.

Second Embodiment

Figure 7E:
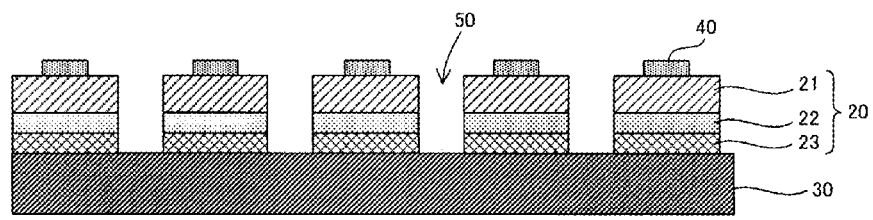
FIGS. 7E-7G are cross-sectional views showing a manufacturing method according to a second embodiment of the present invention.

In the following, a second embodiment according to the present invention is described. In the present embodiment, the processes, which were described above with reference to FIGS. 2A-2E, are the same as those in the first embodiment, but only the step S60 (the dividing process of devices) which was described above with reference to FIGS. 3E-3G is different from that in the first embodiment. However, in this example, the thickness of the metal support 30 was set to 120 μm. Other differences are explained with reference to FIGS. 7E-7G.

(Device Dividing Step; Step S60) Along the street groove 50 formed on the semiconductor film 20, the metal support 30 is cut by using a laser scribing method using YAG crystal (Yttruim•Aluminium•Garnet) as a laser medium, for example, to separate the semiconductor devices. In the present embodiment, dividing of the devices is done by using two stages of the laser beam radiation (steps S61, S62) having different conditions for the laser beam radiation, which form dividing grooves having different cross-sectional shapes from both sides of the metal support 30. Details of the dividing of the devices are explained in the following.

(First Laser Scribing Step; Step S61) The wafer is held by adhering an adhesive tape 60 to the surface of the semiconductor film 20 in which street grooves are formed. Next, a first dividing groove 51 having a trapezoidal or rectangular cross-section that does not penetrate through the metal support 30 (that is, the groove ends within the metal support 30) is formed by radiating a laser beam onto the back side plane (the opposite side to the side of the metal support 30 having the semiconductor film 20 formed thereon) of the metal support 30 along the device dividing line (that is, along the street groove 50) by a laser scribing method. In the laser scribing method, the shape, the depth, and the width of the dividing groove can be controlled by the conditions of the laser beam radiation, as mentioned above.

In the same way as described above with reference to FIG. 6, in the present embodiment, the conditions of the laser beam radiation are adjusted based on the present inventors' finding that the conditions of the laser beam radiation and the shape of the resulting dividing groove formed in the metal support have certain relationships.

In the present embodiment, the output power of the laser beam was 4 W, the pulse width was 20 nsec, the oscillation frequency was 20 kHz, and the scanning speed was 50 mm/sec. By the radiation of the laser beam under such conditions, the first dividing groove 51 having a trapezoidal cross-section having a depth of about 60 μm is formed in the metal support 30 (FIG. 7F).

Figure 7F:
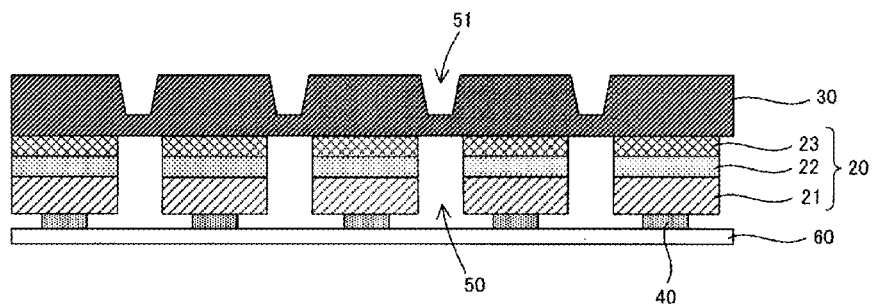

As shown in FIG. 7F, it is preferable that the first dividing groove 51 has a trapezoidal or rectangular cross-section so that its bottom is a plane. By having a trapezoidal or rectangular cross-section in the first dividing groove 51, it becomes easy to align a second dividing groove 52 that is to be formed in the subsequent second laser scribing process with the first dividing groove 51. This is preferable from the viewpoint of improving the production and/or chip yield. In other words, if the first dividing groove 51 has a V-shaped or semicircular cross-section, it would be much more difficult to align the second dividing groove 52 in the following second laser scribing process, which may lead to separation failure.

The deeper the first dividing groove 51 is, the shallower the depth of the second dividing groove 52 that will be formed in the subsequent second laser scribing step needs to be. Hence, the width of the second dividing groove 52 can be made narrow, and this is preferable from the viewpoint of improving the number of chips that can be manifested from a single wafer (the chip yield). However, when the thickness of the remaining film of the metal support 30 below the first dividing groove 51 is too thin, the molten metal may fall to the sides of the semiconductor film 20, and may be attached to the side plane of the semiconductor film 20. This may lead to short circuit failure. In order to avoid this trouble, in the first laser scribing process, the depth of the first dividing groove 51 needs to be determined such that the thickness of the remaining film of the metal support is at least 30 µm. In addition, considering the handling ability of the wafer when the wafer is brought into or amounted on a processing apparatus, for example, it is preferable that the thickness of the remaining film of the metal support 30 is equal to or larger than 50 µm. In the present embodiment, as described above, the depth of the first dividing groove was set to 60 µm, and the thickness of the remaining film of the metal support 30 was set to 60 µm as a result.

(Second Laser Scribing Step; Step S62) Next, the adhesive sheet 61 is adhered to the surface of the metal support 30 in which the first dividing groove 51 is formed, and the adhesive sheet 60 on the side of the semiconductor film 20 is removed. Then, by radiating a laser beam onto the metal support 30 which is exposed at the bottom of the street groove 50 along the device dividing line (that is, along the street groove 50), a second dividing groove 52 having a V-shaped (having a sharp angled tip) cross-section reaching to the bottom plane of the first dividing groove is formed, thereby dividing the wafer into individual devices. That is, the second dividing groove 52 is formed from the surface of the metal support 30 on which the semiconductor film 20 is formed, which is opposite to the surface of the metal support 30 on which the first dividing groove 51 is formed. The second dividing groove 52 is formed such that the second dividing groove 52 penetrates through a part of the metal support 30 which has a thinner film thickness due to the first dividing groove 51.

Figure 7G:
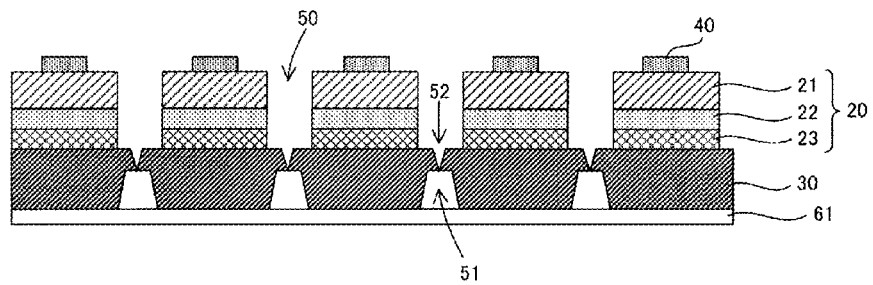

In the similar way as in forming the first dividing groove 51, the shape, the depth, and the width of the second dividing groove 52 can be controlled by the output power of the laser beam, the oscillation frequency, the scanning speed, etc. In the present embodiment, in forming the second dividing groove 52, the output power of the laser beam was 2 W, the pulse width 30 nsec, the oscillation frequency was 70 kHz, and the scanning speed was 100 mm/sec. By radiating the laser beam under such conditions, the second dividing groove 52, which groove width is narrower than that of the first dividing groove 51 and which penetrates through the metal support 30, is formed (FIG. 7G). Also, the alignment of the first dividing groove 51 and the second dividing groove 52 with respect to each other can be realized by using a laser scribing system having an image recognition mechanism that can observe both sides of the wafer simultaneously.

As described above, by forming the second dividing groove 52 having a V-shaped cross-section, the laser beam having the focused laser power is radiated. Because of this, it is possible to evaporate the thin film of metal support 30 instantaneously without re-welding the metal support 30. As a result, the metal support 30 can be easily separated, thereby efficiently dividing the wafer of semiconductor devices into individual chips. On the other hand, if the second dividing groove 52 having a rectangular or trapezoidal cross-section were formed, re-welding may have been induced, thereby making the separation incomplete. Therefore, it is important that the second dividing groove 52 has a V-shaped or similar cross-section for stable separation. Also in the present embodiment, the metal support 30 is nearly perfectly separated. However, even if re-welding of the metal support 30 occurs partially, the devices can be divided by using the conventional breaking method. That is, in the manufacturing method of the present embodiment, because the dividing grooves are formed from both sides of the metal support 30, the re-welding part, even if it occurs, is positioned at the middle section in the depth direction. And the crystalline characteristic of the metal support 30 in the re-welding part is different from that of the other part of the metal support 30. Therefore, the dividing of the devices can be done easily by applying a stress externally. By going through above-mentioned steps, the manufacture of a semiconductor device is completed.

As described above, by using the manufacturing method of the present embodiment, because the dividing grooves having different cross-sectional shapes to each other are formed from both sides of the metal support 30, it becomes possible to easily cut the metal support 30 having the relatively thick film thickness (equal to or larger than 60 µm), which has been difficult to separate by using the conventional method. Also, by forming the first dividing groove 51 having a flat bottom plane on the back side of the wafer, the film thickness of the metal support 30 at the device dividing line is made effectively thin. Therefore, the output power of the laser beam required for forming the second dividing groove 52 can be reduced, and the groove width can be made narrow. Thus, it becomes possible to reduce the amount of flying metal particles during the formation of the second dividing groove 52 on the surface on the side of the semiconductor film 20, which results in an improved yield.

Further, because the first dividing groove 51 having a relatively wide groove width is formed on the backside surface of the metal support 30, and because the second dividing groove 52 having a relatively narrow groove width is formed on the front side surface, it becomes possible to increase the number of semiconductor devices manufactured out of a single wafer, as compared with the conventional dividing method. For example, in the conventional dividing method using a single laser beam radiation, in order to divide a metal support having a thickness of 80 µm, the laser beam radiation need be done with a high output power of the laser beam. As a result, the opening width of the V-shaped dividing groove has to be quite large, and the street groove width needs to be about 120-130 µm. This is not suitable for the mass production from the viewpoint of the production yield and the chip yield. In contrast, because in the manufacturing method of the present invention, the groove width of the second dividing groove 52 can be as narrow as about several µm, the output power of the laser beam can be reduced, and the street groove width can be made to be equal to or less than 10 µm. This makes it possible to divide the devices without sacrificing the chip yield or with an increased yield.

Also, because the second dividing groove 52 is formed on the side of the semiconductor film 20, even if a molten metal drops during the formation of the second dividing groove 52, the molten metal will not be attached to the semiconductor film 20. Therefore, a stable production yield can be achieved.

As described above, in the manufacturing method of the present embodiment, devices with a metal support having the film thickness of equal to or larger than 60 µm, for which dividing devices has been difficult in conventional ways, can be divided stably and effectively using a laser scribing method. As a result, the metal support can be made thicker, and it becomes possible to manufacture semiconductor devices having improved heat dissipation and improved handling ability. Also, in the manufacturing method of the present embodiment, existing laser scribing apparatus can be used as is, and no new system is necessary.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A manufacturing method for semiconductor devices having a metal support, comprising:
    growing a semiconductor film on a growth substrate;
    forming a metal support on a surface of said semiconductor film opposite to the growth substrate;
    thereafter removing said growth substrate from the said semiconductor film;
    forming a street groove reaching said metal support in the said semiconductor film;
    radiating a first laser beam onto said metal support that has been exposed at a bottom of said street groove to form a first dividing groove having a substantially flat bottom in said metal support; and
    radiating a second laser beam onto said bottom of the first dividing groove to form a second dividing groove penetrating through the metal support and having a width smaller than a width of the first dividing groove.

2. The manufacturing method according to claim 1, wherein a cross-section of said second dividing groove has a pointed tip.

3. The manufacturing method according to claim 1, wherein an oscillation frequency of said second laser beam is higher than an oscillation frequency of said first laser beam.

4. The manufacturing method according to claim 1, wherein a scanning speed of said second laser beam is lower than a scanning speed of said first laser beam.

5. The manufacturing method according to claim 1, wherein a thickness of said metal support remaining below said first dividing groove before the step of radiating the second laser beam is less than or equal to about 40 µm.

6. A manufacturing method for semiconductor devices having a metal support, comprising:
    growing a semiconductor film on a growth substrate;
    forming a metal support on a surface of said semiconductor film opposite to the growth substrate;
    thereafter removing said growth substrate from said semiconductor film;
    forming a street groove reaching said metal support in the said semiconductor film;
    radiating a first laser beam onto a surface of said metal support from a side opposite to a side on said semiconductor film is formed to form a first dividing groove having a substantially flat bottom in said metal support; and
    radiating a second laser beam onto a surface of said metal support that has been exposed at a bottom of said street groove to form a second dividing groove reaching a bottom of the first dividing groove, thereby penetrating through said metal support.

7. The manufacturing method according to claim 6, wherein said first dividing groove has a rectangular or trapezoidal cross-section.

8. The manufacturing method according to claim 6, wherein a width of said second dividing groove is narrower than a width of said first dividing groove.

9. The manufacturing method according to claim 6, wherein an output power of said second laser beam is lower than an output power of said first laser beam.

10. The manufacturing method according to claim 6, wherein an oscillation frequency of said second laser beam is higher than an oscillation frequency of said first laser beam.

11. The manufacturing method according to claim 6, wherein a thickness of said metal support remaining below said first dividing groove before the step of radiating the second laser beam is greater than or equal to about 30 µm.

12. The manufacturing method according to claim 1, wherein the thickness of said metal support remaining below said first dividing groove before the step of radiating the second laser beam is greater than or equal to about 50 µm.

13. A manufacturing method for semiconductor devices having a metal support, comprising: growing a semiconductor film on a growth substrate; forming a metal support on a surface of said semiconductor film opposite to the growth substrate; thereafter removing said growth substrate from said semiconductor film; forming a street groove reaching said metal support in the said semiconductor film; radiating a first laser beam onto said metal support to form a first dividing groove having a substantially flat bottom in said metal support; and radiating a second laser beam onto said metal support to form a second dividing groove that penetrates through a portion of said metal support that remains where the first dividing groove is formed.

14. The manufacturing method according to claim 13, wherein a width of said second dividing groove is narrower than a width of said first dividing groove.

15. The manufacturing method according to claim 13, wherein an output power of said second laser beam is lower than an output power of said first laser beam.

16. The manufacturing method according to claim 13, wherein an oscillation frequency of said second laser beam is higher than an oscillation frequency of said first laser beam.

* * * * *